United States Patent [19]

Woodbury et al.

[11] Patent Number: 5,770,880
[45] Date of Patent: Jun. 23, 1998

[54] P-COLLECTOR H.V. PMOS SWITCH VT ADJUSTED SOURCE/DRAIN

[75] Inventors: Dustin Alexander Woodbury, Indian Harbour Beach; James Douglas Beasom, Melbourne Village; James Winthrop Swonger, Palm Bay, all of Fla.

[73] Assignee: Harris Corporation, Melbourne, Fla.

[21] Appl. No.: 707,271

[22] Filed: Sep. 3, 1996

[51] Int. Cl.$^6$ ............ H01L 29/76; H01L 29/94; H01L 31/062

[52] U.S. Cl. ............ 257/336; 257/339; 257/342; 257/344; 257/345; 257/408; 257/409; 438/286; 438/298; 438/305; 438/306

[58] Field of Search .................. 257/339, 342, 257/344, 408, 336, 345, 409; 437/40, 41; 438/286, 298, 305

[56] References Cited

U.S. PATENT DOCUMENTS

| | | | |
|---|---|---|---|
| 4,532,534 | 7/1985 | Ford et al. | 257/139 |
| 4,892,836 | 1/1990 | Andreini et al. | 257/342 |
| 4,926,243 | 5/1990 | Nakagawa et al. | 257/335 |
| 4,947,232 | 8/1990 | Ashida et al. | 438/257 |
| 4,974,059 | 11/1990 | Kinzer | 438/138 |
| 4,978,628 | 12/1990 | Rosenthal | 257/341 |
| 5,040,043 | 8/1991 | Ohno et al. | 257/374 |
| 5,073,511 | 12/1991 | Musumeci et al. | 438/288 |
| 5,132,235 | 7/1992 | Williams et al. | 438/294 |
| 5,138,409 | 8/1992 | Kawai | 257/327 |
| 5,140,392 | 8/1992 | Ikemasu | 257/409 |
| 5,147,811 | 9/1992 | Sakagami | 257/336 |
| 5,158,463 | 10/1992 | Kim et al. | 438/205 |
| 5,198,692 | 3/1993 | Momose | 257/591 |
| 5,218,228 | 6/1993 | Williams et al. | 257/593 |
| 5,229,308 | 7/1993 | Vo et al. | 438/234 |
| 5,234,853 | 8/1993 | Ikemasu | 438/241 |
| 5,262,339 | 11/1993 | Mori et al. | 257/342 |
| 5,298,770 | 3/1994 | Im | 438/138 |
| 5,345,101 | 9/1994 | Tu | 438/268 |
| 5,349,225 | 9/1994 | Redwine et al. | 257/336 |
| 5,362,982 | 11/1994 | Hirase et al. | 257/408 |
| 5,371,394 | 12/1994 | Ma et al. | 438/217 |
| 5,376,568 | 12/1994 | Yang | 438/298 |
| 5,384,279 | 1/1995 | Stolmeijer et al. | 438/217 |
| 5,397,905 | 3/1995 | Otsuki et al. | 257/495 |
| 5,401,682 | 3/1995 | Yang | 438/140 |
| 5,408,118 | 4/1995 | Yamamoto | 438/220 |
| 5,413,945 | 5/1995 | Chien et al. | 257/659 |
| 5,422,510 | 6/1995 | Scharf et al. | 257/467 |
| 5,427,963 | 6/1995 | Richart et al. | 438/257 |
| 5,429,964 | 7/1995 | Yilmaz et al. | 438/268 |
| 5,434,095 | 7/1995 | Hollinger | 257/133 |
| 5,434,443 | 7/1995 | Kelly et al. | 257/401 |
| 5,436,486 | 7/1995 | Fujishima et al. | 257/378 |
| 5,567,965 | 10/1996 | Kim | 257/336 |

Primary Examiner—Valencia Martin Wallace
Attorney, Agent, or Firm—Jaeckle Fleischmann & Mugel, LLP

[57] ABSTRACT

A PMOS device has an n-type body 12 and a triple source drain diffusion. A first drain region 14 is heavily p-doped to provide ohmic contact to the drain. A lightly doped drain region 16 extends to and beneath a portion of the gate 20. A third shallow moderately p-doped region 50 extends from beneath a portion of the gate into the second lightly doped region. The third region 50 counteracts a radiation induced gate inversion layer and reduces the on resistance of the PMOS device.

9 Claims, 2 Drawing Sheets

P-COLLECTOR H.V. PMOS SWITCH VT ADJUSTED SOURCE/DRAIN

BACKGROUND

This invention relates in general to MOS devices, and in particular to MOS devices with breakdown voltages in the range of 40 to 100 volts.

The breakdown voltage for MOS devices is defined as the voltage required to cause avalanche breakdown of the body drain junction (when the device is not limited by punch through). There are two basic MOS structures for breakdown voltages in the range of 40 to 100 volts. These MOS device structures are a double diffused structure and an extended source and drain structure.

Double diffused structures use low impurity graded diffused regions to form source/body and drain/body junctions. See for example the device structure shown in FIG. 1. There, a substrate 10 has an n-type body 12. A gate 20 on a gate oxide 22 extends between a source 30 and drain 40. The source and drain are essentially identical. So, further reference will only be made to the drain, but it is understood that the source can be substituted for the drain. Each drain has a double diffusion consisting of a first heavily doped contact region 14 and a more lightly doped drain region 16. The diffusions are made by opening apertures 19 in oxide layer 18, implanting the exposed surface of substrate 10 with p-type ions (e.g. boron) and annealing the implant to diffuse the ions into the substrate 16 to form p-type regions 14, 16. The contact region 14 is generally confined to the surface and does not extend deeply into the n-type body 12. The second more lightly doped p-type region 16 extends deeply into the body 12 and partially beneath the gate 20. Region 16 forms a junction with the n-type body 12 and that junction establishes the breakdown voltage for the device 10. The diffusion 16 has a low doping concentration gradient that reduces the electric field which forms around the reverse bias body drain junction. This allows a higher voltage to be applied to the device before breakdown is reached.

The high surface concentration and low resistivity p+ regions 14 are often formed in the drain and source regions to reduce the series resistance between the channel and a metal contact (not shown) where channel current flows through them. Such high concentration regions also reduce contact resistance between the contact metal and the region itself. The high surface concentration regions 14 can be defined by the same mask (e.g. oxide layer 18 and apertures 19) that is used to define the source and drain diffusions 16 which result in the conventional double diffused structure. Alternatively, the high concentration regions 14 can be defined using a different mask from that used to define the drains 16. The different masks provide greater flexibility for setting the lateral space between the edge of the high concentration layer 14 and the edge of the low concentration layer 16.

FIG. 2 shows an extended drain and source MOS in which the heavily doped p-type contact regions 14 have laterally extending more lightly doped drain regions 216 that overlap a portion of the gate 20. Note that like reference numbers are used in different figures to identify like structures. The heavily doped p-type regions 14 are contacted by metal conductors. The adjacent, lower concentration regions 216 perform a similar function as lower concentration regions 16 in FIG. 1. The regions 216 provide lightly doped diffusion regions between the more heavily doped p-type regions 14 and the n-type body 12.

Radiation degrades the performance of the device shown in FIG. 1. We found that radiation dramatically increased the on resistance of the device. The increase is greatest when the device has a high body-to-source bias voltage. We believe that the problem is positive trapped holes that are held in the gate oxide. When the device is irradiated, positive charges collect in the gate oxide. These positive charges in effect deplete the drain region 16 of carriers where the drain regions 16 meet the channel 13 interfering with the linkage of the channel 13 to the drain. So, radiation tends to invert the surface of the p-type drain regions 16 to create n-type inversion layers where those regions abut the channel 13. While the precise mechanism for this degradation of on resistance and heightened magnitude at large body-to-source bias is not clear, nevertheless it is clear that such on resistance must be reduced in order to provide effective devices.

There are a number of prior art devices that include two or more regions of different conductivity to form drains in MOS devices. These prior art devices include structures for lightly doped drains, punch through protection, guard band structures, and IGBT and LDMOS structures. Here follows a summary of those types of structures together with reference to U.S. Patents illustrating the individual type of structures.

Lightly Doped Drains (LDD)

Four groups exist that are all variations on the lightly doped drain (LDD) where lightly doped regions of the same type as the drain are placed between the drain and the channel to separate the heavily doped region from the channel. (i) An extended drain LDD (See U.S. Pat. Nos. 5,234,853; 5,218,228; 5,132,235; 5,140,392; 5,138,409 [HVMOS]; 5,198,692 [HVBipolar]; 5,229,308 [HVBIMOS]) uses a lightly doped implant to extend the drain and form the LDD structure. (ii) A Side Implanted LDD (U.S. Pat. No. 5,427,963 [LVMOS]) uses a side implant to accomplish the LDD structure under the gate edge. (iii) A Double Diffused LDD (U.S. Pat. Nos. 5,376,568 HVMOS; 5,401,682 HV IC'S; 5,436,486 HVIGBT; 5,158,463 HLVBIMOS) uses a pair of nested implant/diffusions to form an LDD structure. (iv) A Spacer Masked LDD (U.S. Pat. No. 5,384,279 LVMOS) uses an implant that is partially masked by a sidewall spacer. In all of the LDD structures listed above lightly doped regions are interposed between the drain and the channel; that structure spreads the drain depletion so that the electric field is reduced near the gate.

Punch Through Protection

Another class of multi-diffusion structures has protection regions that are the same type as the body and are located between the source drain and the channel. Three variations of punch through protection structures are listed here. Some of these examples also incorporate LDD structures. An Inverted Double Diffused Extended Channel (U.S. Pat. Nos. 5,371,394; 4,926,243; 4,947,232 [HVMOS]; 5,147,811 LVMOS) accomplishes punch through protection by embedding the source drain diffusion in an opposite type diffusion, thus surrounding the source drain with a region of the same type as the body. Side Implanted Extended Channel (U.S. Pat. No. 5,413,945 LVMOS) has a combination of regions of the same type as the body implanted under the sides of the gate. An extended channel structure (U.S. Pat. No. 5,422,510 MOS) provides punch through protection approach by varying the doping along the channel. The punch through protection structures listed above use regions of the same conductivity type as the body.

Guard Band Structures

A Guard Band Structure (U.S. Pat. Nos. 5,345,101 [All HV]; 4,978,628 [HVCMOS]) uses a moderately heavily doped region that is the same type as the body. It closely resembles the punch through protection cases discussed above. However, the guard band is placed at the edge of the body and functions mainly to elevate the threshold voltage, Vt, of the parasitic field device rather than the main MOS device. The above patents are representative of guard band structures Those skilled in the art know that there are many other examples of guard band structures.

IGBT and LDMOS Structures

There are three groups of IGBT and LDMOS. A Double Diffused Base (U.S. Pat. Nos. 5,429,964; 5,073,511; 5,434,095 [HVMOS]; 5,434,443; 5,397,905 [HVBIMOS]) uses a double diffusion in the base to separate the heavily doped region in the base from the substrate to preserve breakdown. The Standard IGBT or LDMOS (U.S. Pat. Nos. 4,532,534; 5,298,770; 4,974,059; 5,040,043; 5,408,118; 4,892,836) uses a lightly doped region that is the same type as the base region to control the Vt of the MOS part of the device. A Simplified IGBT or LDMOS (U.S. Pat. No. 5,262,339) is essentially equivalent to the standard IGBT and LDMOS but omits the lightly doped region. All of the IGBT and LDMOS structures above use a heavily doped region of the same type as the substrate acting as a low voltage source junction in the MOS device. Some of these use multiple diffusions of the same type as the base to separate the heavy doping from the substrate for enhanced breakdown characteristics.

Despite the extensive multiple diffusion structures of the prior art, no structure has been found to correct the radiation induced increased on resistance problem described above. Accordingly, there is a need for an integrated circuit structure and a process for making same that remedies the radiation induced higher on resistance in PMOS devices.

SUMMARY

We have found that the problems of increased on resistance after irradiation in PMOS devices can be solved by using a shallow, moderately doped implant of the same type as the drain and opposite the body within a double diffused device structure. In particular, the moderately doped implant is placed near the channel edge to reduce on resistance while nevertheless retaining a high breakdown voltage. More specifically, a double diffused structure such as that shown in FIG. 1 of the prior art is treated with a p-type implant, typically the p-type implant that is used to adjust the threshold voltage of the NMOS devices. The p-type implant is made into the surface of the PMOS devices in regions where the lightly doped graded p-type diffusions overlap the gate. As such, a moderate p-type implant is placed in the surface of the graded lightly doped p-type diffusions in order to counteract the partially depleted surface caused by retained radiation charges in the overlapping gate oxide.

The invention provides a novel MOSFET structure, in particular, a novel PMOS structure. It comprises a substrate of semiconductive material having a body region of a first or n-type of conductivity and comprising an elongated channel region at the surface of the body region. A gate region including a gate insulator and a gate electrode are disposed over the channel region. The gate applies an electric field to the channel beneath the gate insulator. Source/drain regions are formed, at opposite ends of the channel regions. Both source/drain regions comprise multiple subregions of a second or p-type conductivity that is opposite to the first or n-type conductivity of the body region. The source/drain regions include a first heavily doped p-type region that is spaced from the channel and is suitable for forming a source drain contact for the PMOS device. A second lightly doped p-type region has a graded conductivity and extends from the heavily doped p-type region into the substrate, toward the channel and beneath the gate to partially underlap the gate. The second lightly doped region gradually decreases in conductivity with distance from the first heavily doped region. The second lightly doped region establishes the breakdown voltage of the PMOS device, i.e., the breakdown voltage between the junction formed by the n-type body region and the p-type lightly doped region. A third moderately doped p-type region is disposed at the surface of the substrate, over the second lightly doped region and extends beneath the portion of the end of the gate region. The third moderately doped region is formed by the NMOS threshold adjust implant. It has a doping concentration of a higher conductivity than the second lightly doped region but is less than the conductivity of the first heavily doped p-type region. The third moderately doped p-type region reduces the on resistance of the PMOS device without substantially reducing the breakdown voltage between the n-type body region and the second p-type lightly doped region.

One of the features of the structure is that its manufacture is compatible with existing processes. As pointed out above, the third moderately doped p-type region is formed using the NMOS p-type threshold adjust implant. The PMOS devices are suitably masked to provide openings over the ends of the channel regions so that the moderately doped p-type implant can be implanted into the surface of the PMOS devices proximate to the ends of the channels. The implant process is generally carried out through a screen oxide mask with photoresist formed over the center of the channel.

DETAILED DESCRIPTION

Figure 1:
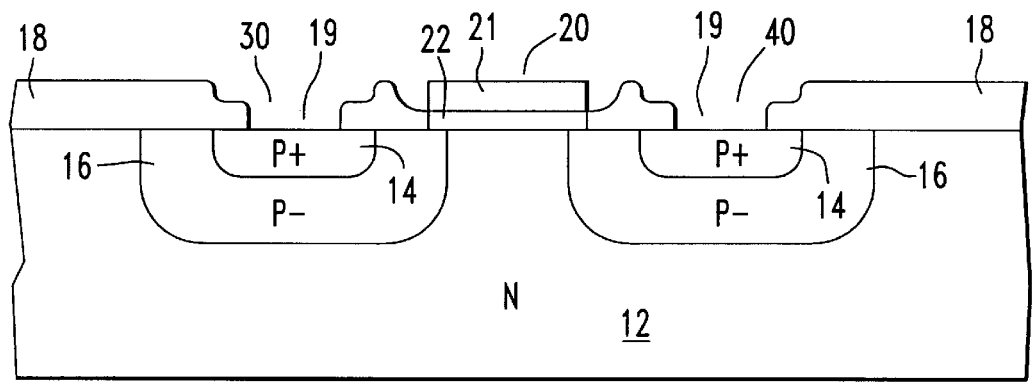
FIG. 1 is a cross sectional view of a prior art doubled diffused MOS device.
Figure 2:
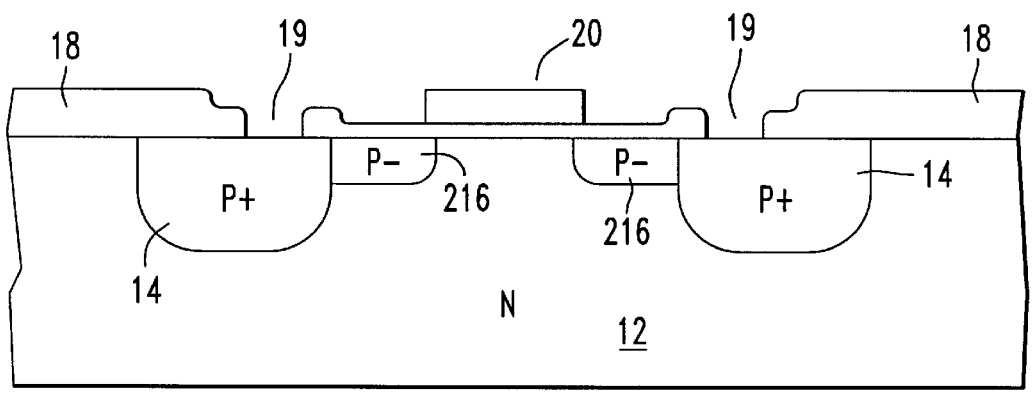
FIG. 2 is a cross sectional view of a prior art extended lightly doped drain MOS device.
Figure 3:
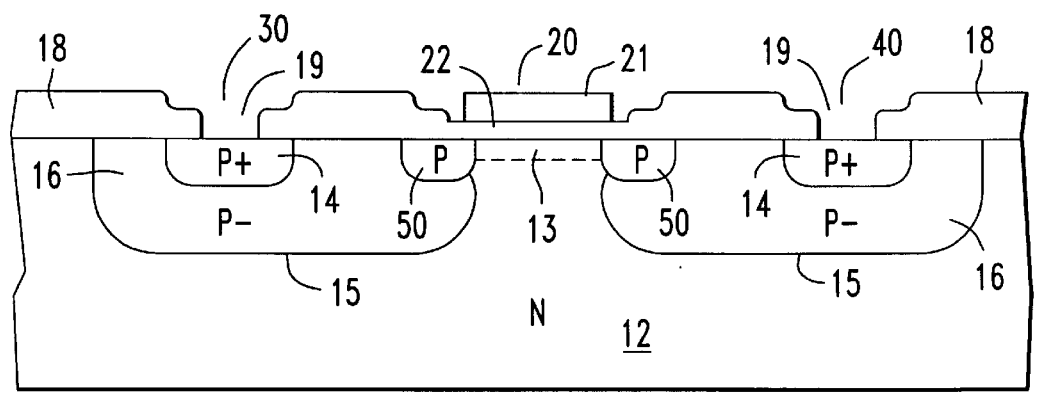
FIG. 3 is a cross sectional schematic of a PMOS device including the invention.

Turning to FIG. 3, there is shown an illustration of a cross section of a PMOS device including the invention. Like reference numerals in FIGS. 1, 2, and 3 refer to like structures; different reference numerals are used to illustrate the differences between the invention and the prior art. The device 100 of FIG. 3 has a semiconductor substrate 10 with an n-type body 12. Heavily p-type doped source drain contact diffusions 14 provide contact to conductors connected to other devices or to external electrical circuits. In the example described here, the respective source and drain regions 16 are formed by a non self aligned mask sequence for the heavily doped region 14 and the lightly doped region 16. Region 16 is formed by making an opening 19 in layer 18 where the lightly doped region is implanted typically with boron and diffused. Then region 14 is formed by reopening 19 (aligned and re-sized as needed) and implanting the heavily doped region, also typically boron, and diffusing it. The graded, lightly doped p-type region 16 extends slightly beneath the outer edges of gate 20. The channel region 13 extends between the respective boundaries of the source drain regions and the n-type body region 12. At the surface of the substrate 10 proximate to the boundary between the source drain diffusions 16 and the body 12, there are moderately doped p-type implant regions 50. The moderately doped p-type implants 50 have a concentration greater than the source drain regions 16 but substantially less than the more heavily doped p-type contact regions 14. The moderately doped p-type regions 50 counteract the depletion effect of an irradiated gate 20 and thereby lowers the on resistance of the PMOS device 100. However, the moderate p-type implants 50 are sufficiently shallow and small enough so that they do not substantially alter the breakdown voltage formed by the junction of the p-type drain regions 16 and the n-type body 12. As such, the device 100 retains its breakdown voltage in the region of 40–100 volts and will still turn on even after the gate 20 is subjected to radiation.

Figure 4:
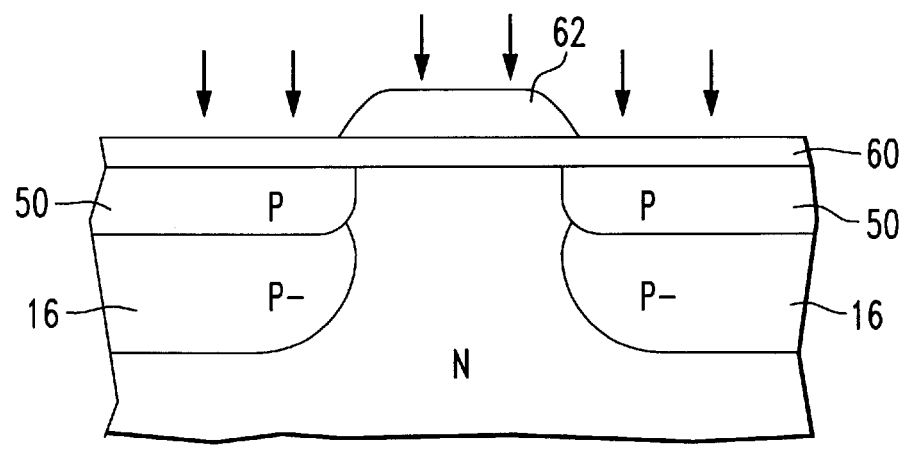
FIGS. 4, 5, and 6 show sequential steps in the formation of the device shown in FIG. 3.
Figure 5:
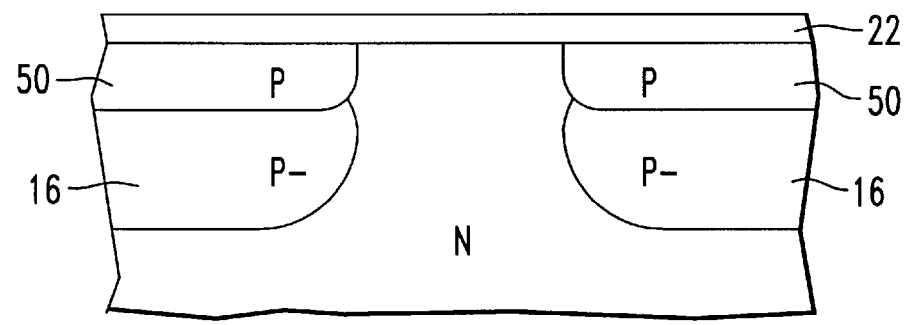
Figure 6:
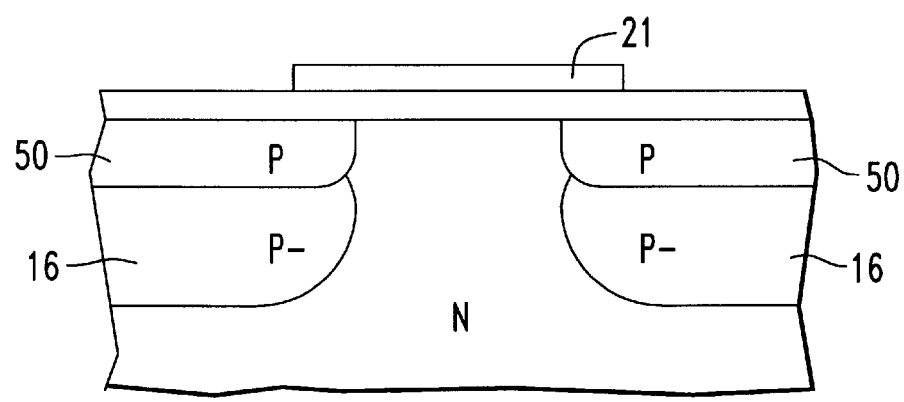

With reference to FIGS. 4–6, there are shown sequential steps to treat a portion of the substrate 10 of an integrated circuit to form the moderately doped region 50 in a PMOS device. Those skilled in the art understand that NMOS devices may be simultaneously formed in the same substrate 10. Fabrication of NMOS and PMOS devices on the same substrate is well known to those skilled in the art. The process step shown in FIG. 4 corresponds to the threshold adjustment step that is typically performed on a NMOS device to adjust its threshold. A portion of the substrate 10 having the PMOS device is provided with a screen oxide layer 60. The screen oxide 60 is suitably patterned by a photoresist mask 62. As shown in FIG. 4, the lightly doped source/drain regions 16 have already been formed. The threshold adjust implant is a moderately doped p-type implant that forms the shallow moderately doped p-type regions 50 that are disposed at the surface of the source drain regions 16. The screen oxide 60 is stripped and a suitable gate oxide 22 is disposed over the surface of the substrate 10. Next a polysilicon layer 21 is deposited and patterned to provide an overlapping gate electrode. The gate electrode overlaps portions of both the moderately doped p-type implants 50 and the source drain implants 16 that extend toward and beneath the gate 20.

The p-type diffusions 14, 16, and 50 are formed with boron using different implants and heat treatments. For example: the lightly doped region 16 may be implanted with $10^{14}$ ions/cm$^2$ at 80 keV and diffused for 15 hours at 1200° C.; the heavily doped region 14 may be implanted with $10^{16}$ ions/cm$^2$ at 50 keV and diffused for 1 hour at 900° C.; and the moderately doped region 50 may be implanted at $10^{12}$ ions/cm$^2$ at 40 keV and diffused during the 875° C. gate oxidation. There are numerous combinations of three different levels of p-type dopants that can be used to form PMOS devices of the invention. It is important to keep the third implant shallow and its concentration greater than the implant 16 in the region where implant 50 is made.

Those skilled in the art will appreciate that some of the boron implanted in region 16 is consumed during thermal oxidation steps, such as the step creating oxide layer 60. Those skilled in the art will also understand that the precise relationship between the lateral penetration of regions 16 and 50 depends upon how long each is diffused with respect to each other. In the preferred embodiment, both regions 50, 16 have about the same lateral penetration. However, it is within the scope of the invention that region 50 be within region 16 and that region 50 extend slightly beyond region 16.

Having thus shown and described the preferred embodiment of the invention, those skilled in the art will appreciate that further modifications, changes, alterations, and deletions to the structures and steps shown in the preferred embodiments may be made without departing from the spirit and scope of the invention as set forth in the following claims. For example, the shallow third p-type implant could be added to the extended drain structure of FIG. 2 and to any of the other lightly doped drain structures of the prior art.

We claim:

1. A MOSFET comprising:

a substrate of semiconductor material having body region of a first type of conductivity and comprising an elongated channel region of said first type of conductivity;

a gate region comprising a gate insulator disposed over the channel region and a gate electrode on the gate insulator for applying an electric field to the channel beneath the gate insulator;

two source drain regions, each at opposite ends of the channel region, both source drain regions comprising multiple regions of a second type of conductivity opposite to the first type of conductivity, said multiple regions including;

a first heavily doped region spaced from the channel and forming a source drain contact for the MOSFET;

a second lightly doped region of graded conductivity extending from the heavily doped region into the substrate, toward the channel and beneath the gate region to partially underlap the gate, said second lightly doped region establishing a breakdown voltage for the MOSFET between the body region and the second lightly doped drain region; and a third moderately doped region disposed at the surface of the substrate, over the second lightly doped region and extending beneath a portion of the end of the gate region, said third moderately doped region having a higher conductivity than the second lightly doped region and a lower conductivity than the first heavily doped region, said third moderately doped region reducing the on resistance of the MOSFET without substantially reducing the breakdown voltage between the body region and the second lightly doped region.

2. The MOSFET of claim 1 wherein the third moderately doped region is inside the second lightly doped region.

3. The MOSFET of claim 1 wherein the third moderately doped region extends laterally slightly beyond the second lightly doped region.

4. The MOSFET of claim 1 wherein the first type of conductivity is n-type and the second type of conductivity is p-type.

5. The MOSFET of claim 1 wherein the second and third regions extend beneath the gate about the same distance.

6. The MOSFET of claim 1 wherein the third region is interposed in the space between the side diffusion edges of the first and second regions.

7. A MOSFET comprising:

a substrate of semiconductor material having body region of a first type of conductivity and comprising an elongated channel region of said first type of conductivity;

a gate region comprising a gate insulator disposed over the channel region and a gate electrode on the gate insulator for applying an electric field to the channel beneath the gate insulator;

two source drain regions, each at opposite ends of the channel region, both source drain regions comprising multiple regions of a second type of conductivity opposite to the first type of conductivity, said multiple regions including;

a first heavily doped region spaced from the channel and forming a source drain contact for the MOSFET;

a second lightly doped region of graded conductivity extending from the heavily doped region into the substrate, toward the channel and beneath the gate region to partially underlap the gate, said second lightly doped region gradually decreasing in conductivity with distance from the first heavily doped region, said second lightly doped region establishing a breakdown voltage for the MOSFET between the body region and the second lightly doped region; and a third moderately doped region disposed at the surface of the substrate, in the second lightly doped region and abutting the end of the gate region, said third moderately doped region having a higher conductivity than the second lightly doped region and a lower conductivity than the first heavily region, said third moderately doped region reducing the on resistance of the MOSFET without substantially reducing the breakdown voltage between the body region and the second lightly doped region.

8. The MOSFET of claim 7 wherein the first type of conductivity is n-type and the second type of conductivity is p-type.

9. The MOSFET of claim 7 wherein the second and third regions both extend to the gate edge.

* * * * *